United States Patent [19]

Takiar

[11] Patent Number: 5,625,235
[45] Date of Patent: Apr. 29, 1997

[54] MULTICHIP INTEGRATED CIRCUIT MODULE WITH CROSSED BONDING WIRES

[75] Inventor: Hem P. Takiar, Fremont, Calif.

[73] Assignee: National Semiconductor Corporation, Santa Clara, Calif.

[21] Appl. No.: 490,776

[22] Filed: Jun. 15, 1995

[51] Int. Cl.$^6$ ............................ H01L 23/28; H01L 23/48
[52] U.S. Cl. ............................ 257/776; 257/676; 257/790; 257/723; 257/725; 257/690; 257/666
[58] Field of Search ........................... 257/690, 666, 257/723, 724, 725, 776, 674, 784, 786, 790–794

[56] References Cited

U.S. PATENT DOCUMENTS

| | | | |
|---|---|---|---|
| 5,097,317 | 3/1992 | Fujimoto et al. | 257/790 |
| 5,325,268 | 6/1994 | Nachnani et al. | 257/666 |
| 5,362,984 | 11/1994 | Konda et al. | 257/666 |
| 5,373,188 | 12/1994 | Michii et al. | 257/666 |

FOREIGN PATENT DOCUMENTS 0084991  3/1994  Japan ............................ 257/784

*Primary Examiner*—Sara W. Crane
*Assistant Examiner*—Alexander Oscar Williams
*Attorney, Agent, or Firm*—Hickman Beyer & Weaver

[57] ABSTRACT

Multichip integrated circuit modules having crossed bonding wires are disclosed together with methods of making the same. The integrated circuit dies of the multi-chip modules are affixed to a suitable die supporting substrate. The dies are then electrically coupled to each other and/or to associated lead traces by wire bonding the dies, with at least two of the bonding wires being crossed. The integrated circuit dies, the bonding wires, and at least a portion of the lead traces are enclosed in a package. In one embodiment, the bonding wires used in the wire bonding step are precoated with an insulating material. In another embodiment, the insulating layers are formed on the bonding wires after the wire bonding step to prevent shorting between the wires. The insulating layers may be formed in a variety of manners. By way of example, the wires can be oxidized, or they may be coated with a protective material.

5 Claims, 5 Drawing Sheets

MULTICHIP INTEGRATED CIRCUIT MODULE WITH CROSSED BONDING WIRES

BACKGROUND OF THE INVENTION

The present invention relates generally to the packaging of multichip integrated circuit modules. More particularly, it relates to the use of bonding wires that cross one another to connect integrated circuits in a multi-chip package.

Semiconductor integrated circuits are currently mass produced for a broad range of purposes. Therefore, cost and quality improvements in their manufacturing are valuable since even small savings in the costs of packaging can translate to large overall cost savings when mass produced.

In recent years, the popularity of multichip modules (MCM's) or multichip packages (MCP's) that contain more than one integrated circuit die has increased because they provide the convenience of complex components composed of several simpler integrated circuits. The terms multichip module and multichip package will be considered synonymous throughout this application. One drawback of multichip modules is that they may require complicated bonding wire topographies to connect the dies to external leads or to each other or to, both. In the past, a variety of techniques have been used to accomplish these interconnections. Referring next to FIGS. 1a–1d, a variety of known MCM wire bonding techniques will be described.

Referring initially to FIG. 1a a simple bonding wire arrangement for a conventional multichip module 10 is illustrated. Integrated circuit dies 12 are attached to die attach pads 14 of a lead frame. Bonding wires 16 electrically connect the dies 12 to external leads 18 of the lead frame. In this embodiment, the various dies are not connected together in any way. Although this type of multichip module is simple and inexpensive to produce, there are often times when it is necessary to interconnect the dies. Indeed it is usually necessary to interconnect the dies in order to make full use of the benefits of multichip packaging.

An improvement is shown in FIG. 1b wherein the bonding wires 16 connect the dies 12 to each other in addition to the external leads 18. However, to prevent the bonding wires from shorting one another, the bonding wires are not crossed in any way. Although some interconnection is allowed using this approach, the inability to cross the bonding wires significantly restricts the number of connections that can be made between adjoining dies. Clearly, the desire for more complicated wiring topographies is easily imagined. To circumvent this problem, some manufacturers connect the dies via traces that pass through the substrate. Alternatively, a jumper chip may be provided to facilitate the connections. FIGS. 1c and 1d show these two alternatives.

In FIG. 1c, the dies 12 are on the mounted on a substrate 20. The substrate 20 has a plurality of surfaces traces 22. There are also a variety of submerged traces that run through the substrate. The dies can then be connected by wire bonding between a first die and a first end of a trace on the substrate using a first bonding wires 16 and then wire bonding between a second die and a second end of the trace. In this manner good connections can be made without crossing the bonding wires which again would risk shorting. Similarly, as seen in FIG. 1d a jumper chip 24 may be provided in place of or in addition to the traces that run through the substrate to facilitate connections between the dies. The jumper chip 24 has a multiplicity of traces 26 which can be accessed by the bonding wires 16 without requiring any of the bonding wires to cross. Unfortunately, the substrate and jumper chip solutions are expensive. Indeed, when substrates or jumper chips are used, they account for most of the cost of MCM manufacture. The design of the submerged substrate connections and their implementation are also complicated. Accordingly, a simple, inexpensive method permitting crossed bonding wires without shorting would thus be desirable.

SUMMARY OF THE INVENTION

To achieve the foregoing and other objects and in accordance with the purpose of the present invention, multichip integrated circuit modules having crossed bonding wires are disclosed together with methods of making the same. The integrated circuit dies of the multi-chip modules are affixed to a suitable die supporting substrate. The dies are then electrically coupled to each other and/or to associated lead traces by wire bonding the dies, with at least two of the bonding wires being crossed. The integrated circuit dies, the bonding wires, and at least a portion of the lead traces are enclosed in a package.

In one embodiment, the bonding wires used in the wire bonding step are precoated with an insulating material. In another embodiment, the insulating layers are formed on the bonding wires after the wire bonding step to prevent shorting between the wires. The insulating layers may be formed in a variety of manners. By way of example, the wires can be oxidized, or they may be coated with a protective material.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE INVENTION

Figure 1A:
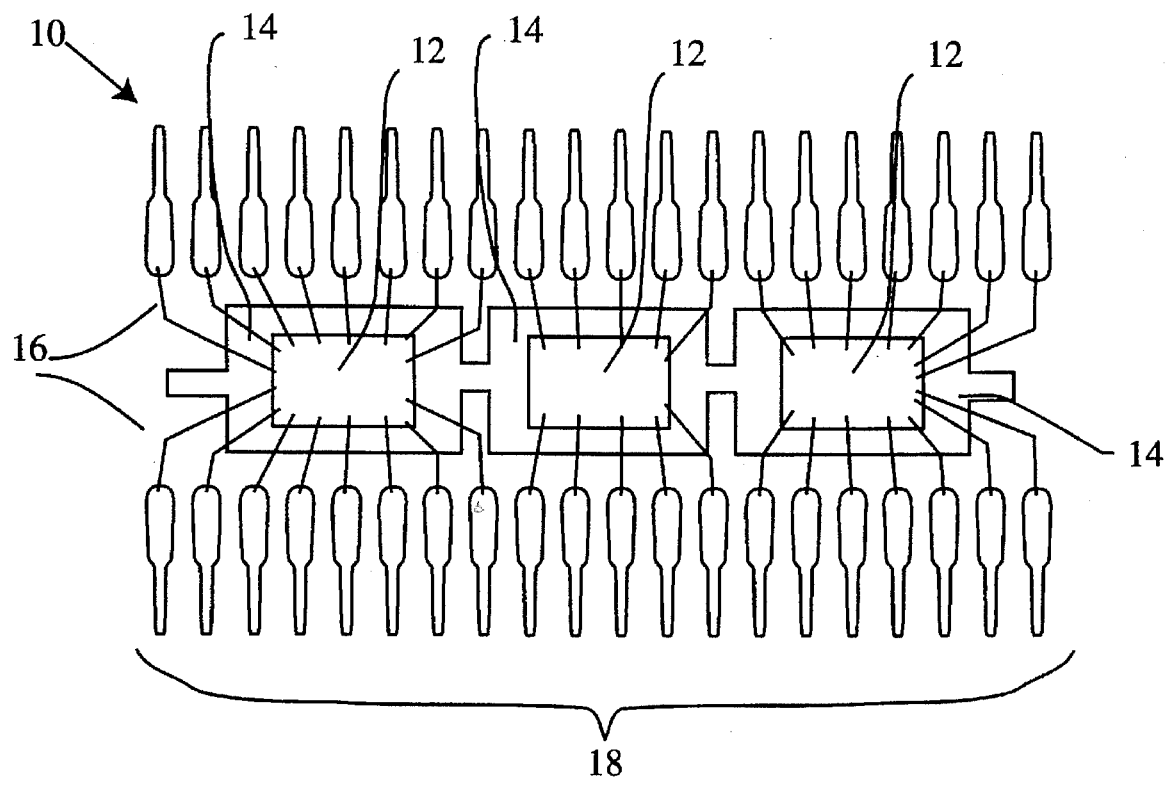
FIGS. 1a–d illustrate conventional wire bonding schemes for multichip modules.
Figure 1B:
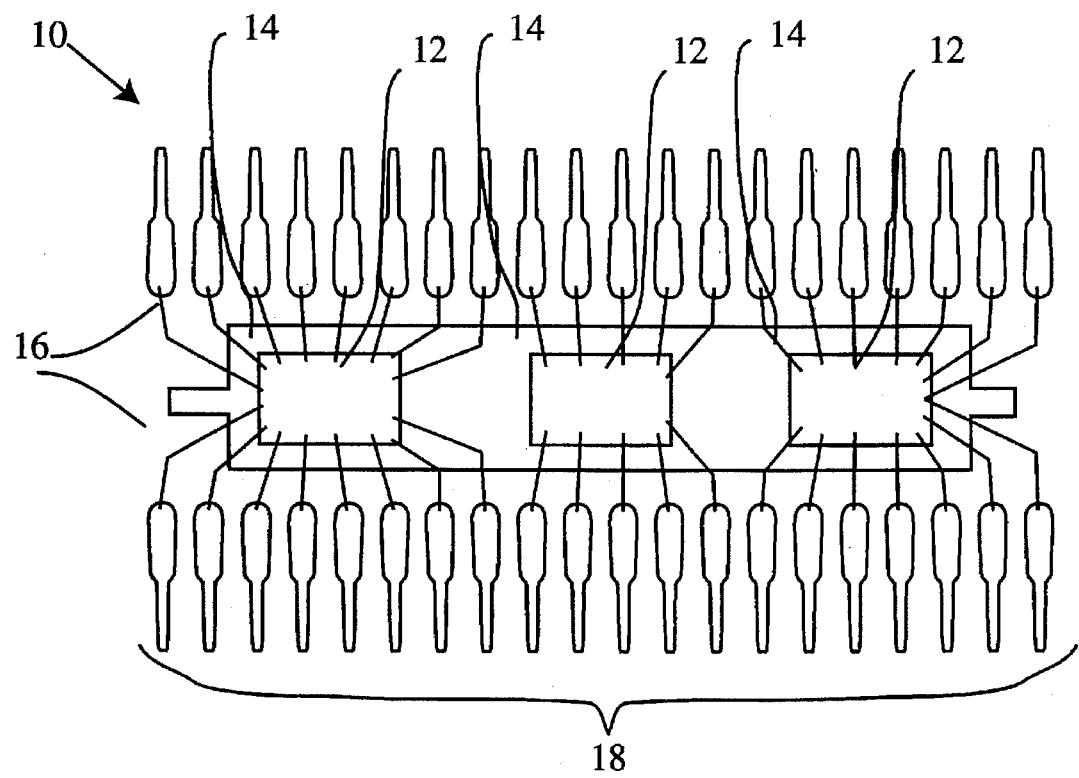
Figure 1C:
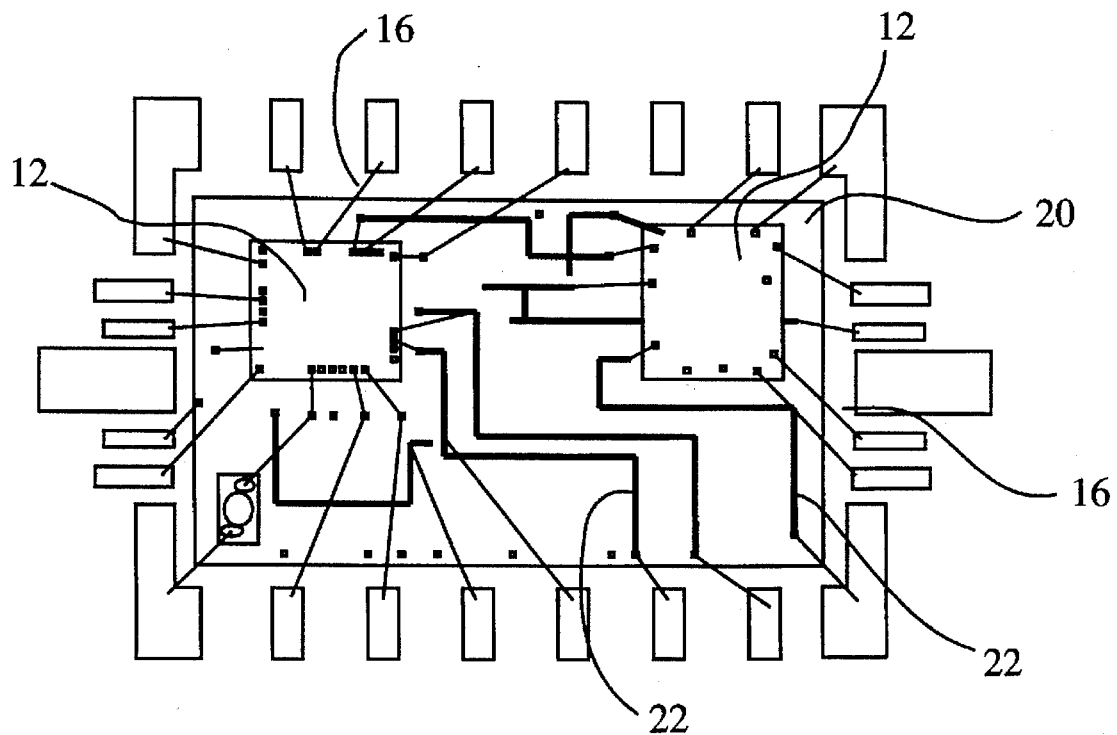
Figure 1D:
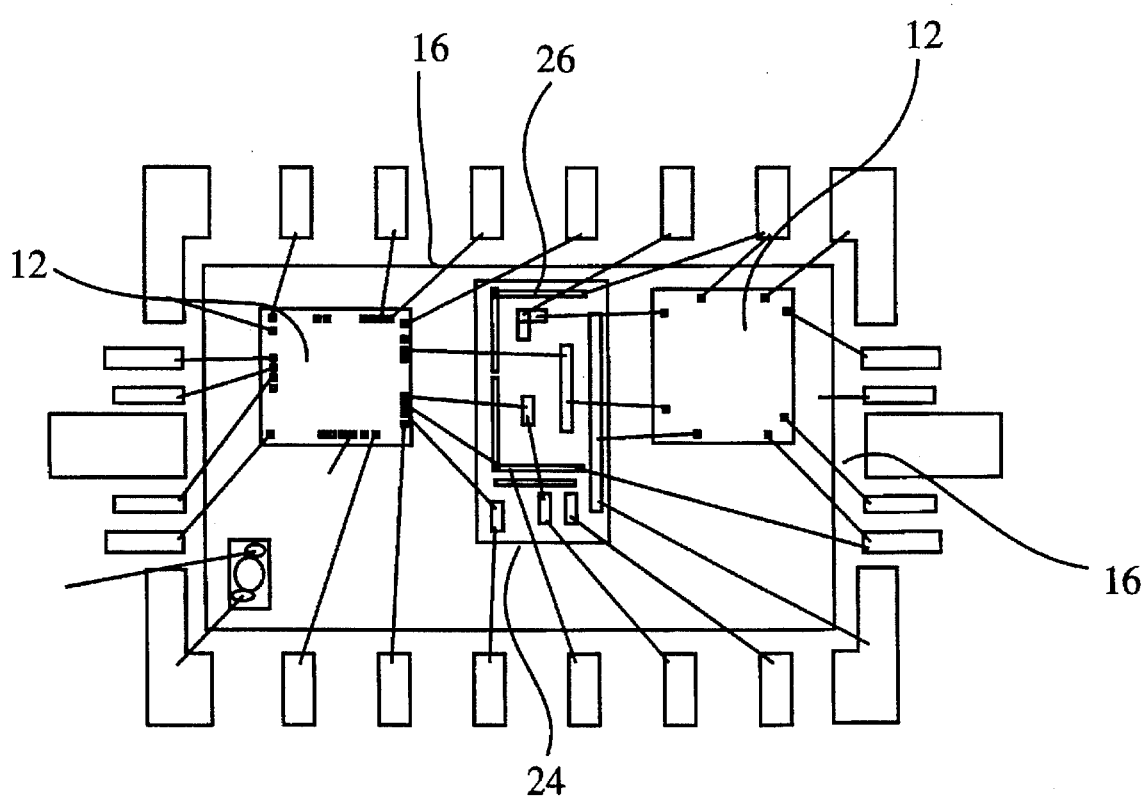
Figure 2A:
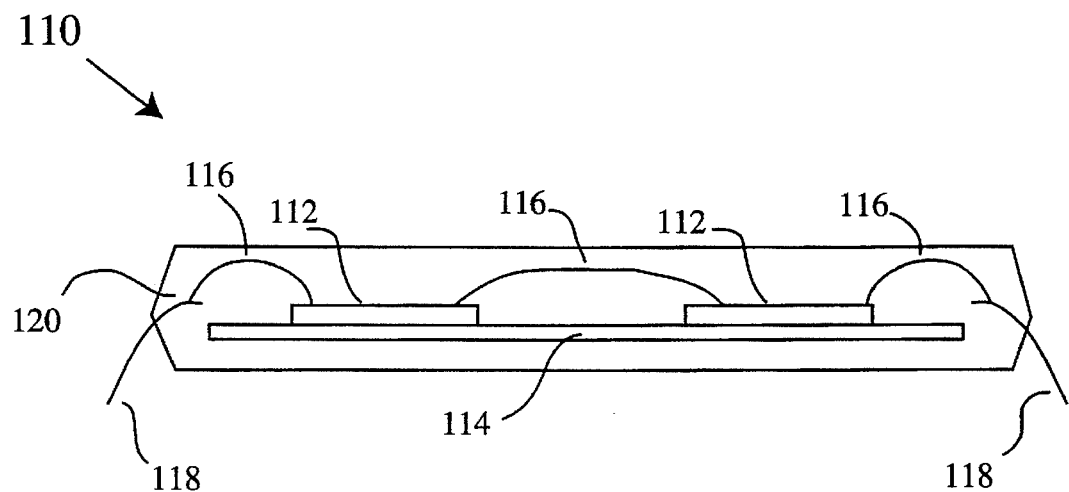
FIGS. 2a–b illustrate a wire bonding arrangement in accordance with the present invention.
Figure 2B:
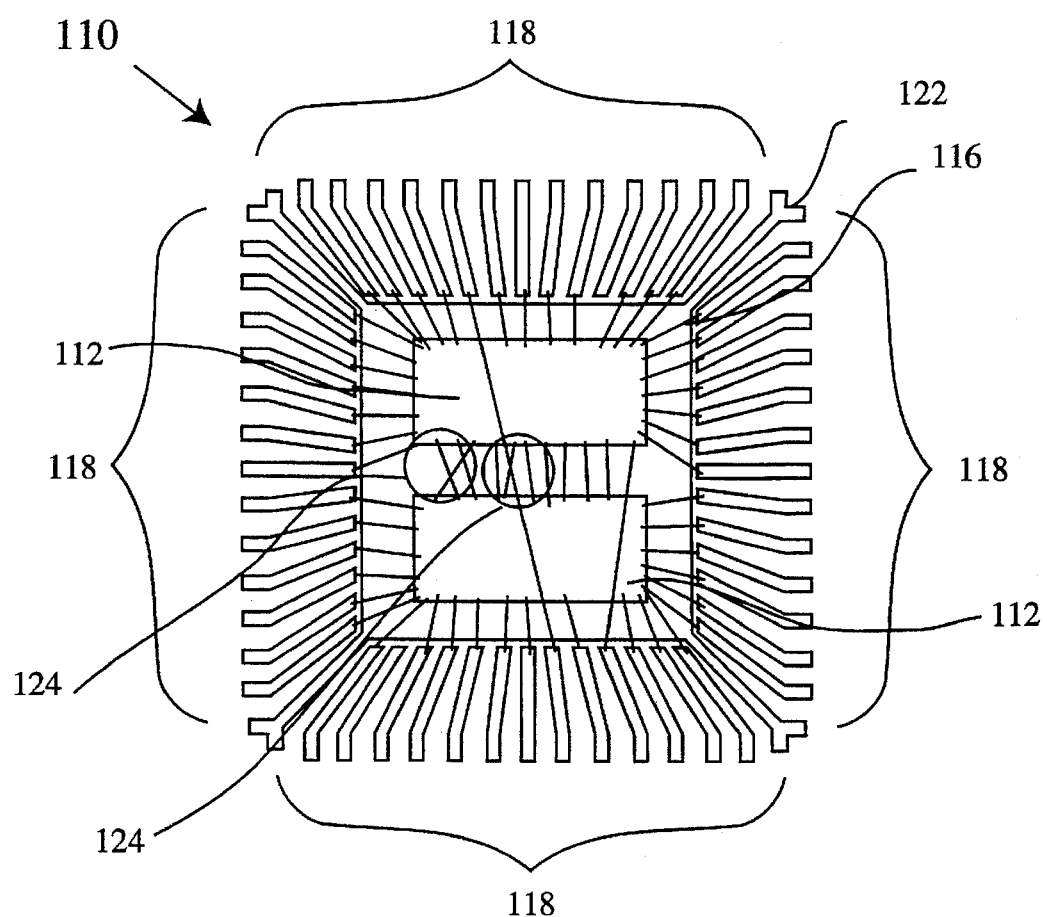

Referring initially to FIGS. 2a and 2b, a multichip package or module 110 having at least some crossed bonding wires and made in accordance with the present invention is illustrated. As seen therein, integrated circuit dies 112 are attached to a die pad or other suitable surface such as substrate 114. Bonding wires 116 connect the dies 112 to each other and connect the dies 112 to external lead which take the form of a lead frame 118. A package 120 surrounds the dies 112, the substrate 114, the bonding wires 116, and a portion of the lead frame 118. Ground pins 122 allow grounding of the substrate 114.

Some of the bonding wires 116 are crossed. That is, they are permitted to cross over one another (and therefore are referred to herein as crossed bonding wires 124). Permitting crossed bonding wires is simpler and less expensive than the conventional techniques for handling complicated bonding wire connections which rely on the use of jumper chips and/or connection substrates. When very few crossed bonding wires 124 are desired, the gaps between them can be controlled during packaging to prevent shorting. Otherwise, (and more typically) the crossed wires 124 are insulated from each other. In complicated systems, the insulation methods outlined below are simpler and cheaper to implement than the substrate and jumper chip connection schemes. Accordingly, the method of packaging MCM's of the present invention has advantages over the conventional MCM/MCP packaging methods. The insulation on the bonding wires can be formed in a variety of manners as will be described herein. By way of example, pre-insulated wires can be used. Alternatively, an insulating material can be formed or coated on uninsulated bonding wires after they have been attached.

Figure 3A:
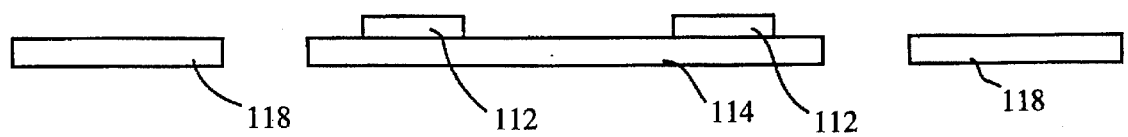
FIGS. 3a–d is a diagrammatic representation of suitable methods of packaging a multichip module in accordance with an embodiment of the present invention.

Referring next to FIGS. 3a–3d, a method of assembling a multichip module 110 in accordance with one embodiment of the present invention will be described. Initially, as illustrated in FIG. 3a the integrated circuit dies 112 are affixed to an appropriate pad which may be a die pad portion of a lead frame, the substrate 114 or any other suitable die mounting surface. This step can be performed using standard die bonding machines.

Figure 3B:
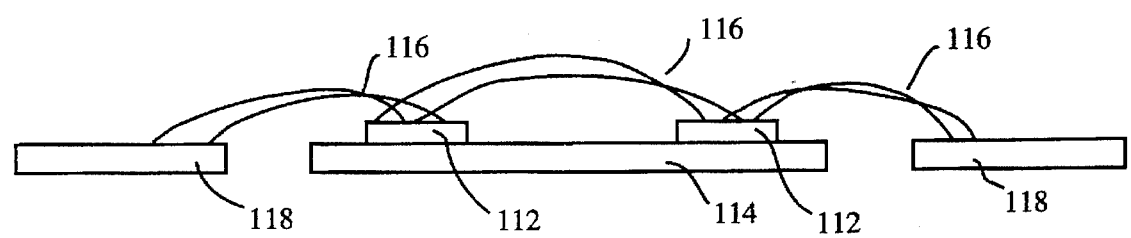

Thereafter, bonding wires are used to electrically interconnect the various dies and to couple the dies to lead frame leads 118 as is illustrated in FIG. 3b. In the wire bonding step, the bonding wires 116 are connected between the integrated circuit dies 112 as well as between the dies and the external leads 118. As best illustrated in FIG. 2b, at least some of the bonding wires 116 are crossed. It should be appreciated that since some of the bonding wires may cross other components, care should be taken to insure that the bonding wires do not cover a bonding pad or lead required for the later bonding of another wire. Generally, the wire bonding can be accomplished by conventional wire bonding machines.

In one embodiment of the invention, the bonding wires are pre-insulated before they are wire bonded into place. A wide variety of insulating materials may be used for the insulation, as for example polymers such as polyurethane, polyester, or nylon. When bonding wire having an insulating coat thereon is used, the insulation at the ends of the wires 116 will typically need to be stripped before wire bonding.

Figure 3C:
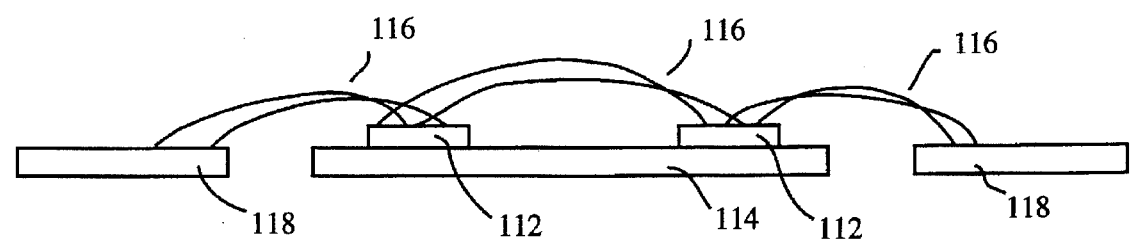
Figure 3D:
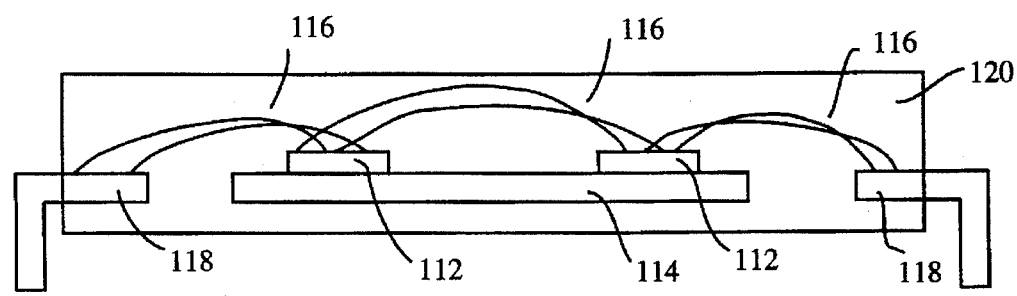

An alternative insulating technique is illustrated in FIG. 3c. In this embodiment, the insulating layers are formed on the bonding wires 116 after the wire bonding step has been completed. Perhaps the simplest way of forming such an insulating layer is to form an oxidation layer on the bare wires 116. By way of example, oxidation layers can be formed by applying an oxidizing reagent to the wires 116 or by heating the wires 116 in the presence of oxygen. A variety of oxidizing agents may be used and of course, the appropriate oxidizing agent is dependent on the material used as the bonding wire. It is also important that the oxidizing agent not be so strong that it attacks and degrades the dies themselves. As will be appreciated by those skilled in the art, a wide variety of oxidizing agents may be used and the appropriate oxidizing agents may vary to some extent based on the type of wiring used. By way of example, in embodiments which utilize bonding wires 116 made of aluminum, copper, or silver, acetic acid and citric acid work well.

Convenient application methods for the reagent include dripping them onto the bonding wires 116 or immersing the bonding wires 116 in the reagent. If the leads 118 are also immersed in the reagent during this step, the leads 118 must be cleaned later to permit connections to external circuitry.

The use of pre-oxidized bonding wires 116 is presently generally avoided because standard wire bonding techniques tend to melt metal oxides in an uncontrolled fashion. However, if more controlled techniques are developed in the future, they could readily take advantage of the present invention as well.

After the bonding wires have be secured in place and are properly insulated (if necessary), a package 120 may be formed to enclose the dies 112, the substrate 114, the bonding wires 116, and the appropriate portions of the lead frame 118. The package 120 may be made from standard packaging materials such as plastics and ceramics. If there are only a small number of wire crossings, and wire insulation is not applied, then it may be advantageous for the package 120 to be a hollow ceramic shell. A hollow shell avoids potential damage and shorting of the bonding wires 116 which sometimes occurs during plastic injection molding. This problem is known in the art as the "wire wash problem".

Figure 4A:
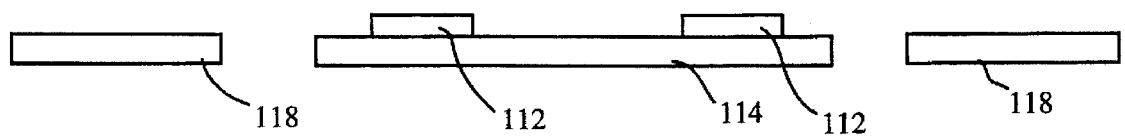
FIGS. 4a–d is a diagrammatic representation of a second method of packaging a multichip module in accordance with a second embodiment of the invention which incorporates a glob-topping step.
Figure 4B:
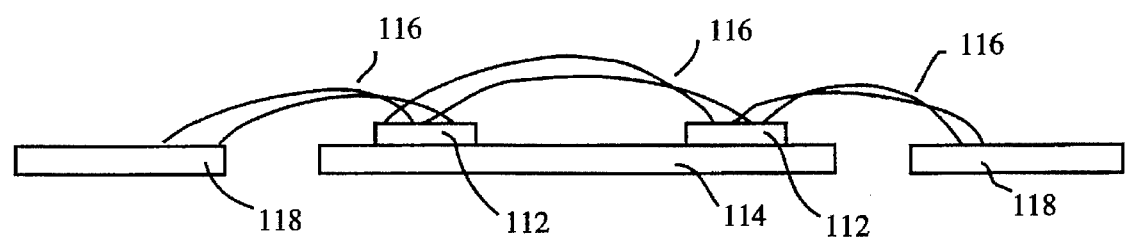
Figure 4C:
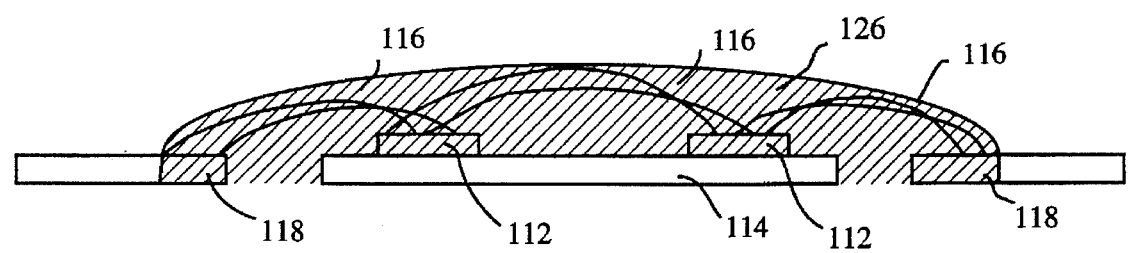
Figure 4D:
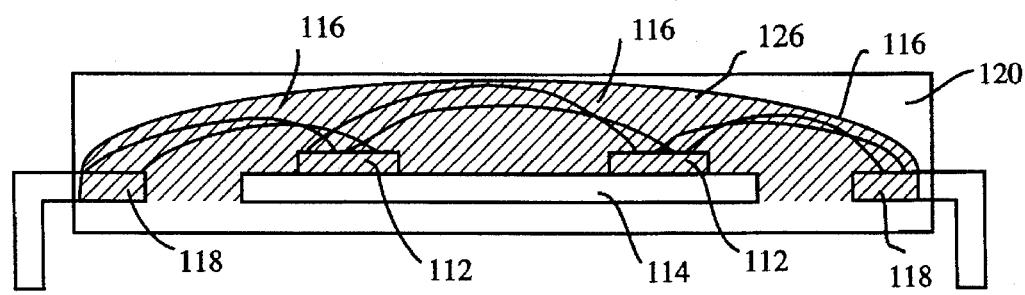

Another embodiment of the method aspect of the present invention is illustrated in FIGS. 4a–e. Once again, the dies 112 are affixed to a suitable support surface on or over the substrate 114 as illustrated in FIG. 4a. Thereafter, as illustrated in FIG. 4b, bonding wires 116 are bonded to the dies 112 and to the leads or lead traces 118. Thereafter, a glob-topping material 126 is applied to envelope to the bonding wires 116 as in FIG. 4d. Glob-topping is a conventional solution to the wire wash problem mentioned above. The glob-topping material 126 can be used as the insulating material itself to prevent damage and shorting of the bonding wires 116 during integrated circuit packaging and after delivery of the packaged integrated circuit.

In alternative embodiments, the bonding wires can be pre-insulated or insulated prior to the glob-topping as discussed above. This technique may be particularly useful when there are only a few wire crossings. Suitable insulating glob-topping materials 126 include silicone, polyimide, and epoxy. Finally, an enclosing step forms a package about the dies 112, the substrate 114, the bonding wires 116, portions of the external leads or lead traces 118, and the glob-topping material 126. The glob-topping material 126 protects the bonding wires 116 during this step.

Although only a few embodiments of the present invention have been described in detail, it should be understood that the present invention may be embodied in many other specific forms without departing from the spirit or scope of the invention. Particularly, the specific materials need not be those explicitly discussed. For example, a variety of reagents other than citric and acetic acid may be used to facilitate oxidation and indeed in some instances, no reagent is required (as for example when aluminum is used). In some applications, it will be desirable to pay attention to routing concerns to insure that exposed portions of the wires can not come into contact with unintended bond pads. This can be done by routing the wires away from bond pads, routing to avoid certain die areas or to insure certain clearances.

As is known to those skilled in the art, when gold bonding wires are used, oxidation based insulation is not generally considered a practical. Therefore, pre-insulation and post bonding insulative coatings may be used. Materials such as aluminum, copper, and silver are more readily amenable to oxidation, however, they to may be used in conjunction with pre-insulated wires or post-bonding coatings. Of course other bonding wire materials could be used as well.

Also, the specific arrangements of elements may be different from those shown in the figures and discussed in the text. For example, the multiple dies may be affixed to more than one die supporting substrate, and/or the die supporting substrates may include standard die attach pads, connection substrates, printed circuit boards or other suitable materials. Further, the invention may be used in conjunction with conventional die connection techniques that make use of traces extending over or though a substrates and/or utilize jumper chips. The advantage of using the present invention in conjunction with such techniques is that it permits the substrate or jumper chip design to be simpler or completely eliminated at the discretion of the manufacturer. The leads are not necessarily part of a lead frame. Indeed, they may be lead traces on a circuit board, lead traces on a substrate of a grid array type package (such as a ball grid array) leads leading to solder bumps on a flip chip packaged integrated circuit, etc. Therefore, the present examples are to be considered as illustrative and not restrictive, and the invention is not to be limited to the details given herein, but may be modified within the scope of the appended claims.

I claim:

1. A multichip integrated circuit module comprising:

a multiplicity of leads;

a plurality of integrated circuit dies electrically connected to the leads;

a multiplicity of bonding wires arranged to electrically connect the integrated circuit dies to each other and to the leads wherein at least two of the bonding wires are crossed, the crossed bonding wires including a metal oxide layer formed on the crossed bonding wires that electrically insulates the crossed bonding wires to prevent short circuiting between the crossed bonding wires; and a package surrounding the multiplicity of integrated circuit dies, the multiplicity of bonding wires, and a portion of the leads.

2. A multichip integrated circuit module as recited in claim 1 wherein the package includes a hollow ceramic shell.

3. A multichip integrated circuit module as recited in claim 1 wherein the package is a plastic package material that encapsulates the integrated circuit dies, the multiplicity of bonding wires, and the portion of the leads.

4. A multichip integrated circuit module as recited in claim 1 wherein the bonding wires are made from materials selected from a group consisting of aluminum, copper, and silver.

5. A multichip integrated circuit module as recited in claim 1 wherein the leads are part of a lead frame.

* * * * *